United States Patent

Nishiwaki et al.

[11] Patent Number: 6,013,970
[45] Date of Patent: Jan. 11, 2000

[54] PIEZOELECTRIC THIN-FILM DEVICE PROCESS FOR MANUFACTURING THE SAME, AND INK-JET RECORDING HEAD USING THE SAME

[75] Inventors: Tsutomu Nishiwaki; Kouji Sumi; Masami Murai; Masato Shimada, all of Nagano, Japan

[73] Assignee: Seiko Epson Corporation, Tokyo, Japan

[21] Appl. No.: 08/812,167

[22] Filed: Mar. 6, 1997

[30] Foreign Application Priority Data

Mar. 6, 1996 [JP] Japan .................................... 8-049026
Mar. 29, 1996 [JP] Japan .................................... 8-077668

[51] Int. Cl.$^7$ .................................................. H01L 41/08
[52] U.S. Cl. .......................... 310/330; 310/358; 310/328; 310/324
[58] Field of Search .................................. 310/328, 324, 310/330–332, 358, 359

[56] References Cited

U.S. PATENT DOCUMENTS

| | | | |
|---|---|---|---|
| 5,376,857 | 12/1994 | Takeuchi et al. ........................ | 310/328 |
| 5,537,863 | 7/1996 | Fujiu et al. ................................ | 73/105 |
| 5,594,292 | 1/1997 | Takeuchi et al. ........................ | 310/324 |
| 5,617,127 | 4/1997 | Takeuchi et al. .................... | 310/328 X |
| 5,691,594 | 11/1997 | Takeuchi et al. ........................ | 310/330 |
| 5,691,752 | 11/1997 | Moynihan et al. ................. | 310/358 X |

OTHER PUBLICATIONS

"Bending Actuator Using Lead Zirconate Titanate Thin Film Fabricated by Hydrothermal Method", Kikuchi et al.; Japanese Journal of Applied Physics, vol. 31, No. 9B, Sep. 1, 1992; pp. 3090–3093, XP000355714.

Primary Examiner—Mark O. Budd
Attorney, Agent, or Firm—Sughrue, Mion, Zinn, Macpeak & Seas, PLLC

[57] ABSTRACT

A piezoelectric thin-film device includes: a substrate and a piezoelectric thin film formed on the substrate, wherein a thickness of the piezoelectric thin film is 1 to 10 $\mu$m, a crystal grain size of the piezoelectric thin film is 0.05 to 1 $\mu$m, and a surface roughness (Rmax) of the piezoelectric thin film is no more than 1 $\mu$m.

10 Claims, 5 Drawing Sheets

TIMING CHART

FIG. 6

| TEMPERATURE ELEVATION (°C/min) | GRAIN SIZE OF SEED CRYSTALS | SURFACE ROUGHNESS AFTER GROWTH BY HYDROTHERMAL SYNTHESIS | | $d_{31}$ (P C/N) |
|---|---|---|---|---|
| 3 | 0.04 μm | Rmax | 0.03 μm | 61 |
| 4 | 0.05 | | 0.04 | 72 |
| 5 | 0.08 | | 0.08 | 79 |
| 6 | 0.1 | | 0.12 | 84 |
| 11 | 0.2 | | 0.22 | 89 |
| 16 | 0.3 | | 0.29 | 89 |
| 21 | 0.4 | | 0.38 | 93 |
| 26 | 0.5 | | 0.50 | 95 |
| 32 | 0.6 | | 0.59 | 96 |
| 42 | 0.8 | | 0.81 | 98 |
| 53 | 1.0 | | 0.99 | 98 |
| 62 | 1.2 | | 1.16 | 99 |

PIEZOELECTRIC THIN-FILM DEVICE PROCESS FOR MANUFACTURING THE SAME, AND INK-JET RECORDING HEAD USING THE SAME

BACKGROUND OF THE INVENTION

The present invention relates to a piezoelectric thin-film device for use in ink-jet recording apparatus or the like, a process for its manufacture, and an ink-jet recording head using such piezoelectric thin-film device.

Piezoelectric thin films typically made of lead zirconate-titanate (hereinafter sometimes abbreviated as PZT) are formed by various methods including a physical vapor deposition (PVD) technique such as sputtering, a chemical vapor deposition (CVD) technique and spin coating such as a sol-gel method, followed by a heat treatment at a high temperature of 700 to 1000° C. A problem with such piezoelectric thin films is that they cannot be made thicker than 1 $\mu$m. To solve this limitation and form thicker piezoelectric films, two approaches are conventionally taken, i.e., increasing the film deposition time or repeating the film formation several times.

Another approach for increasing the thickness of piezoelectric thin films is under review and is based on the use of hydrothermal synthesis which permits the intended reaction to proceed in a low-temperature ($\leq$200° C.) environment. According to a recent article entitled "Preparation of PZT crystalline films by hydrothermal synthesis and their electrical characteristics" in the preprint for the lectures to be read at the 15th Workshop on Electronic Materials, Japan Institute of Ceramics, the hydrothermal synthesis technique as a method for increasing the thickness of piezoelectric thin films comprises a seed crystal forming process in which PZT seed crystals are precipitated on the surface of a metallic titanium substrate and a crystal growing process in which PZT crystals are precipitated and grown on the PZT seed crystals.

The conventional approaches for manufacturing piezoelectric thin films by sputtering, the sol-gel method or the like require a subsequent heat treatment at such high temperatures that they are not suitable for producing films thicker than 1 $\mu$m unless a considerably prolonged time is spent for film formation. Also cracks will develop even if a film of desired thickness is formed.

Thick films can be formed at low temperatures by the hydrothermal synthesis technique but, on the other hand, the crystal grains produced will be as large as several micrometers so that neither dense, smooth films are formed nor is it possible to achieve fine patterning. In order for piezoelectric thin films to be used as piezoelectric devices in an ink-jet recording apparatus and the like, the films must be as thick as about 1 to 10 $\mu$m.

SUMMARY OF THE INVENTION

The present invention has been accomplished under these circumstances and has as an object providing a piezoelectric thin-film device that can be formed in a sufficient thickness by hydrothermal synthesis, that has a high electrostriction constant and that permits fine-line patterning.

Another object of the invention is to provide a process for manufacturing the piezoelectric thin-film device.

A further object of the invention is to provide an ink-jet recording head using the piezoelectric thin-film device.

The first object of the invention can be attained by a piezoelectric thin-film device that is formed on a substrate and which has a piezoelectric thin film having a thickness of 1 to 10 $\mu$m, a crystal grain size of 0.05 to 1 $\mu$m and a surface roughness (Rmax) of no more than 1 $\mu$m.

If the crystal grain size of the piezoelectric thin film is at least 0.05 $\mu$m and more, the required piezoelectricity can be exhibited. If the crystal grain size of the piezoelectric film is no more than 1 $\mu$m, the piezoelectric thin-film device permits fine-line patterning. These numerical conditions can be satisfied by a structure that is created by the growth of a piezoelectric thin film on nuclei composed of the fine seed crystals of a piezoelectric thin film.

If the surface roughness (Rmax) of the piezoelectric thin film is not more than 1 $\mu$m, the latter can be fully covered with an upper electrode.

The lower electrode which makes a pair with the upper electrode is preferably made of platinum. The piezoelectric thin film is oriented in either the (100) or (111) plane. The piezoelectric thin film preferably has a crystal grain size of 0.1 to 0.5 $\mu$m. The upper electrode preferably has a thickness 0.5 to 2 times as great as the surface roughness (Rmax) of the piezoelectric thin film.

If the piezoelectric thin film is at least 1 $\mu$m thick, it provides the piezoelectricity required, for example, by the ink-jet recording head. If the piezoelectric thin film is not thicker than 10 $\mu$m, the desired piezoelectric thin-film devices can be fabricated at high density. Preferably, the thickness of the piezoelectric thin film is 2 to 5 $\mu$m, with 3 $\mu$m being more preferred.

The present invention also provides a piezoelectric thin-film device that is formed on a substrate and which has a piezoelectric thin film of such a structure that crystals have been grown on nuclei composed of fine seed crystals. In a preferred embodiment, the piezoelectric thin film has such a structure that crystals have been grown on nuclei composed of PZT seed crystals by hydrothermal synthesis. The PZT seed crystals are produced by either physical vapor deposition (PVD) or chemical vapor deposition (CVD) or spin coating. As already mentioned, the seed crystals desirably have a grain size of 0.05 to 1 $\mu$m.

The second object of the invention can be attained by a process for manufacturing a piezoelectric thin-film device which includes the step of forming the seed crystals of a piezoelectric thin film on a substrate with a lower electrode by either physical vapor deposition (PVD) or chemical vapor deposition (CVD) or spin coating and then causing the crystals of a piezoelectric thin film to grow on the seed crystals of a piezoelectric thin film by hydrothermal synthesis. The seed crystals of a piezoelectric thin film are specifically formed by either a sol-gel method or a sputtering technique. The seed crystals of a piezoelectric thin film are desirably oriented in the (100) plane if they are formed by a sol-gel method and, in the case where they are formed by sputtering, the orientation is desirably in the (111) plane.

The third object of the invention is attained by an ink-jet recording head comprising a substrate having ink chambers formed therein, a vibrating diaphragm that closes the ink chambers at one end and which has piezoelectric thin-film devices of a flexural vibrating mode fixed on a surface, and a nozzle plate that closes the ink chambers at the other end and which has ink-ejecting nozzle holes formed therein, wherein each of the piezoelectric thin-film devices has a piezoelectric thin film created by the growth of crystals through hydrothermal synthesis on the seed crystals of the piezoelectric thin film that have been formed by either physical vapor deposition (PVD) or chemical vapor deposition (CVD) or spin coating and which have a crystal grain size of 0.05 to 1 μm. In a preferred embodiment, each of the piezoelectric thin-film devices has both an upper and a lower electrode for electrically charging the piezoelectric thin film and also has means of electrically charging the upper electrode such that it has a positive potential relative to the lower electrode.

BRIEF DESCRIPTION OF THE DRAWINGS

FIG. 2b is an enlarged section taken on line A—A of FIG. 2a;

FIG. 4 is a timing chart showing the waveform of a pulsed voltage to be applied to the recording head shown in FIG. 2a;

FIG. 6 is a table showing how the rate of temperature elevation in the preparation of PZT seed crystals is related to the grain size of the seed crystals, the surface roughness of the PZT film grown by hydrothermal synthesis and its electrostriction constant ($d_{31}$).

DETAILED DESCRIPTION OF THE PREFERRED EMBODIMENTS

Preferred embodiments of the present invention will now be described below.

First Embodiment
<Formation of Seed Crystals>

Lead acetate (0.1 mole) was dissolved in 20 mL of acetic acid and the solution was refluxed for 30 min. After reversion to room temperature, zirconium tetrabutoxide (0.052 moles) and titanium tetraisopropoxide (0.048 moles) were dissolved. One mole of water and a small amount of diethylene glycol were added dropwise thereto, and the mixture was stirred thoroughly to effect hydrolysis. Following dilution with 2-ethoxyethanol, hudroxypropyl chamberulose was added in an amount of 5 wt % of the value calculated for a complex metal oxide and the mixture was stirred thoroughly to form a uniform sol.

Figure 1:
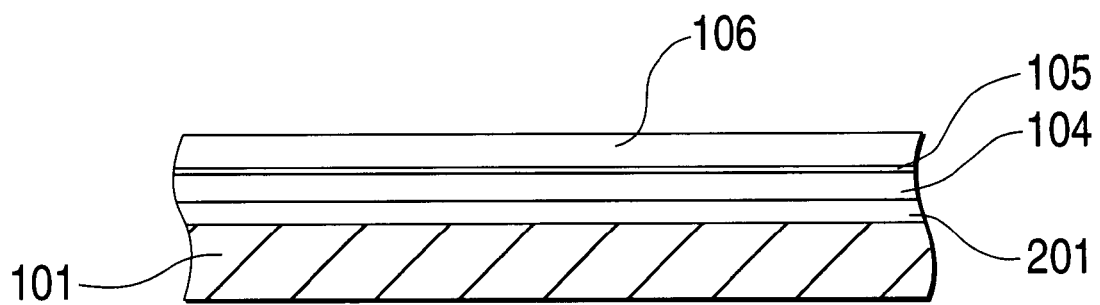
FIG. 1 is a schematic cross section of the piezoelectric thin-film device according to a first and second embodiments of the present invention.

FIG. 1 shows a schematic cross section of a piezoelectric thin-film device. The sequence of steps in the manufacture of the piezoelectric thin-film device are described below. First, a single-crystal silicon substrate 101 is overlaid with a silicon dioxide film 201 as an insulator film by thermal oxidation. Subsequently, a Pt lower electrode 104 is formed on the silicon dioxide film 201 by sputtering and then spin-coated with a sol that has been prepared as already described above, and then calcined at 350° C.

The above procedure enabled an amorphous porous gel thin film to form in a thickness of 0.4 μm without any cracking. The lower electrode was formed of Pt since it would not deteriorate upon intense heat treatment.

In the next step, the calcined substrate was heated in a diffusion furnace at 550° C. and held at that temperature for 1 h (hour), whereby preannealing was effected to form a thin dense film in a thickness of 0.3 μm. By X-ray analysis, peaks for crystals of a perovskite type were detected. The film was subjected to reflective FT-IR (Fourier transform infrared absorption spectral analysis) and no absorption was to have occurred due to hydroxyl groups at about 3400 cm$^{-1}$.

Subsequently, annealing was performed in a diffusion furnace under a circulating oxygen flow by heating at 700° C. for 1 h. Examination of the resulting film with a metallurgical microscope showed that it had on its surface those PZT seed crystals 105 (the seed crystals of a piezoelectric thin film) which had been formed in a thickness of 0.3 μm, with the crystal grains having grown to a size of 0.5 μm.

By X-ray analysis of the PZT seed crystal layer 105, there were detected sharp and intense peaks peculiar to perovskite-type crystals. In this connection, if the PZT seed crystals obtained by the sol-gel method are to be used as seed crystals in hydrothermal synthesis, the crystals are desirably oriented in the (100) plane in order to ensure that the intended piezoelectricity would be realized.

<Crystal Growth>

In the next step, the PZT seed crystals 105 formed by the sol-gel method described above were subjected to hydrothermal reaction, thereby causing a PZT film (layer) 106 to grow on the seed crystals. The reaction solution used in the hydrothermal reaction was prepared by mixing aqueous solutions of lead nitrate Pb(NO$_3$)$_2$, zirconium oxychloride ZrOCl$_2$, titanium chloride TiCl$_4$ and potassium hydroxide KOH.

The other side of the silicon substrate 101 on which the PZT seed crystals 105 were formed was coated with a fluoroplastic resin and wetted with the reaction solution (see above) at 150° C. to perform a hydrothermal treatment for 12 h, whereupon the PZT film 106 grew to a thickness of 3 μm.

Subsequently, an aluminum electrode was deposited on the PZT film 106 by evaporation and the PZT film 106 was found to have salient piezoelectric characteristics as evidenced by a specific dielectric constant of 1200 and a electrostriction constant of 90 pC/N.

The PZT film 106 was also dissolved in aqua regia and the molar ratio of its components (Pb, Zr and Ti) was measured by ICP-AES (inductively-coupled plasma-atomic emission spectroscopy); the result was Pb:Zr:Ti=1:0.52:0.48, which was identical to the composition of the initial feed.

The crystal grains in the PZT film 106 formed by hydrothermal synthesis were of substantially the same size as the PZT seed crystals 105 and the PZT film 106 had a smooth surface with Rmax being 0.4 μm. Thus, by means of the hydrothermal synthesis technique, the PZT film 106 could be formed in such a way that the crystal grain size and the surface roughness (Rmax) were substantially the same as in the layer of PZT seed crystals 105.

In other words, the smaller the size of the PZT seed crystals 105, the denser and the smoother the PZT film 106 that is formed. The required piezoelectricity can be ensured if the size (=grain size=diameter) of the PZT seed crystals 105 is at least 0.05 μm and more.

As long as the size of the PZT seed crystals 105 is not more than 1 μm, a good surface smoothness is provided to ensure that the upper electrode covers the entire surface of the PZT film 106. Preferably, the grain size of the PZT seed crystals 105 is adjusted to lie between 0.1 and 0.5 μm, which achieves a further improvement in the characteristics described above. The grain size of the PZT seed crystals 105 to be obtained by the sol-gel method can be controlled by adjusting the sintering speed and time. The PZT seed crystals 105 will serve the purpose if the film formed of those crystals is thick enough to cover the entire surface of the substrate.

We now describe in detail the method of forming PZT seed crystals of varying thickness by the sol-gel technique. In the sol-gel method, a heat treatment is performed at 700° C. for 1 h to crystallize PZT and the crystal grain size can be varied by adjusting the rate of temperature elevation. FIG. 6 is a table showing how the rate of temperature elevation is related to the grain size of seed crystals, the surface roughness of the film formed by growth in the hydrothermal synthesis method and its electrostriction constant ($d_{31}$). As the grain size increases, the electrostriction constant increases to provide better piezoelectric characteristic. However, in order to achieve fine-line pattering, the grain size of the PZT seed crystals is preferably not more than 1 $\mu$m. As already noted, in the piezoelectric thin-film device of the invention the piezoelectric thin film has a thickness of 1 to 10 $\mu$m, a crystal grain size of 0.05 to 1 $\mu$m and a surface roughness (Rmax) of not more than 1 $\mu$m. In order to obtain these conditions, the PZT seed crystals are preferably heated at a rate of 3 to 53° C./min. If the grain size of these seed crystals is in the rage of 0.1 to 0.5 $\mu$m, the balance between the two needs, one to ensure the required piezoelectric characteristics and the other to permit fine-line patterning, can be attained at a higher level.

In the first case described above, the PZT film 106 is of a purely two-component system. This is not the sole case of the invention and in order to provide better piezoelectric characteristics, the PZT film 106 may be formed of a three-component system such as one consisting of lead-magnesium niobate, lead zirconate and lead titanate; if desired, various additives may be added for various purposes, for example, iron may be added to improve the withstand voltage and chromium may be added to reduce the change with aging. In these modified cases, the composition of the sol solution and that of the hydrothermal reaction solution should of course be altered in accordance with the composition of the PZT film to be formed.

Second Embodiment

We now describe the second embodiment of the invention. In this second embodiment, the piezoelectric thin-film device shown in FIG. 1 is manufactured by the process described below.

First, a single-crystal silicon substrate 101 was overlaid with a silicon dioxide film 201 as an insulator film by thermal oxidation. A platinum (Pt) lower electrode 104 was then formed over the silicon dioxide film 201 by sputtering.

Then, using a target having a $PbZrO_3$:$PbTiO_3$ molar ratio of 52:48, an amorphous PZT film was deposited by sputtering in a thickness of 0.3 $\mu$m. Thereafter, the amorphous PZT film was crystallized by a heat treatment for 1 h at 750° C. in an oxygen atmosphere, whereupon the PZT film was transformed to a layer of PZT seed crystals 105 such that the size of the crystal grains observed on the film surface with a metallurgical microscope was 0.4 $\mu$m and that those seed crystals would exhibit piezoelectricity.

By X-ray analysis of the PZT seed crystals 105, there were detected sharp and intense peaks derived from the perovskite-type crystals. It should be mentioned here that if the PZT seed crystals 105 obtained by sputtering are to be used as seed crystals in hydrothermal synthesis, the crystals are desirably oriented in the (111) plane in order to ensure that the intended piezoelectric characteristics can be realized.

As in the first case, the PZT seed crystals 105 formed by sputtering were subjected to a hydrothermal treatment. The reaction solution was prepared by mixing aqueous solutions of lead nitrate $Pb(NO_3)_2$ zirconium oxychloride $ZrOCl_2$, titanium chloride $TiCl_4$ and potassium hydroxide KOH. The hydrothermal treatment was performed for 12 h, for which time the single-crystal silicon substrate 101 having the PZT seed crystals 105 formed on one surface and which was coated with a fluoroplastic resin on the opposite side was immersed in the reaction solution as the latter was held at 150° C. As the result of the hydrothermal treatment, a PZT film 106 was formed in a thickness of 3 $\mu$m.

Subsequently, an aluminum electrode was deposited on the PZT film 106 by evaporation and the PZT film was found to have salient piezoelectric characteristics as evidenced by a specific dielectric constant of 1100 and a electrostriction constant of 85 pC/N. The thin PZT was also dissolved in aqua regia and the molar ratio of its components (Pb, Zr and Ti) was measured by ICP-AES; the result was Pb:Zr:Ti= 1:0.52:0.48, which was identical to the composition of the initial feed.

The crystal grains in the PZT film 106 formed by hydrothermal synthesis were 0.4 $\mu$m in size which was equal to that of the PZT seed crystals 105 and the PZT film 106 had a smooth surface with Rmax being 0.4 $\mu$m.

In the second embodiment, the PZT seed crystals 105 prepared by sputtering were employed; needless to say, similar results will be obtained even if the PZT seed crystals are formed by chemical vapor deposition (CVD) techniques.

Third Embodiment

Figure 2A:
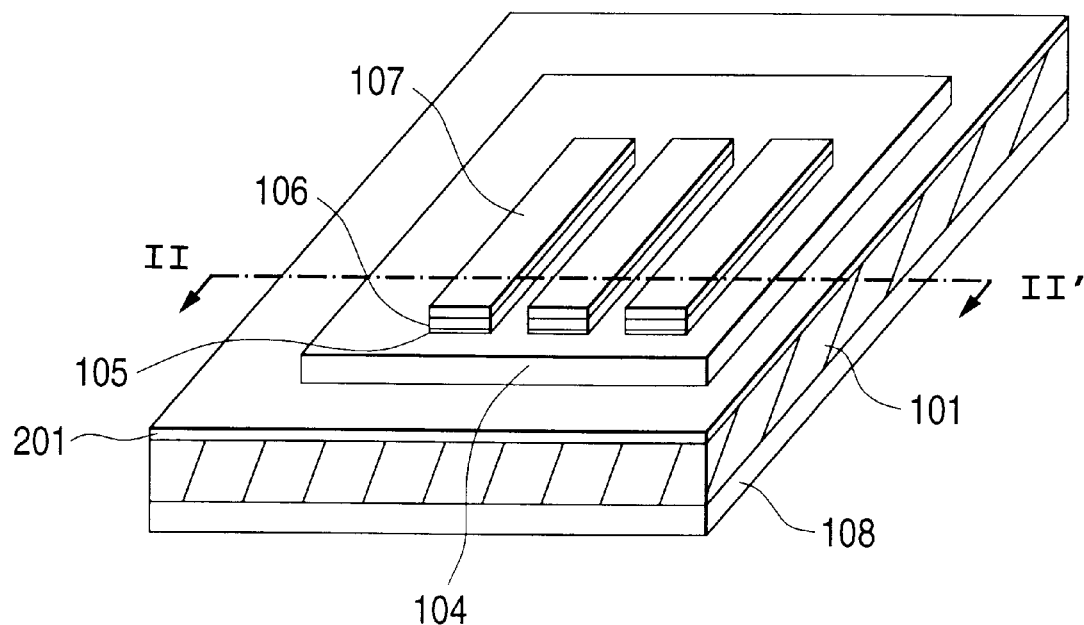
FIG. 2a is a simplified perspective view of the ink-jet recording head according to a third embodiment of the invention.
Figure 2B:
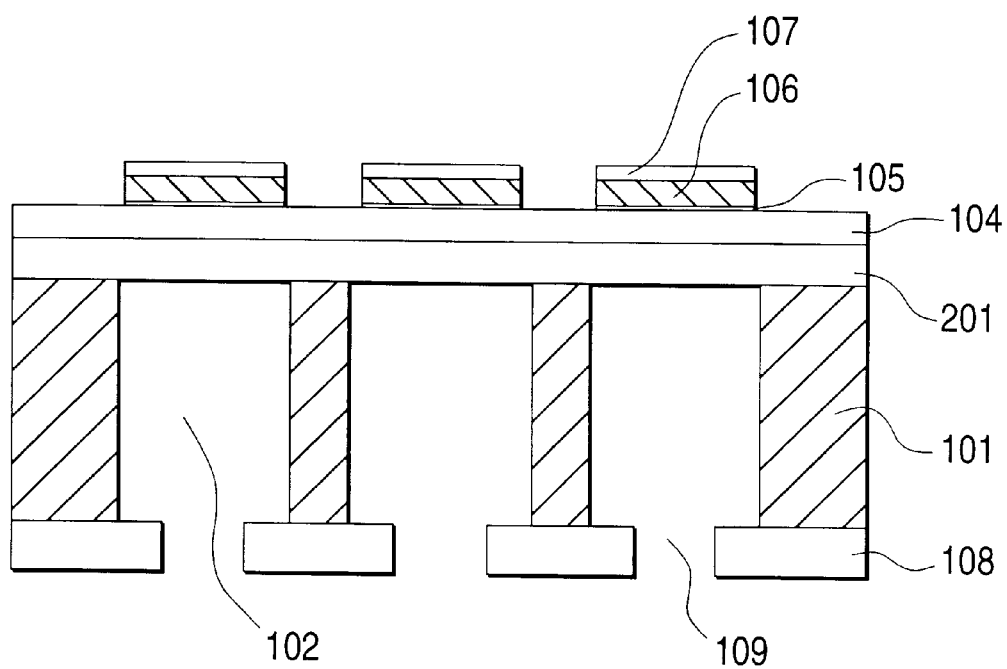

The third mode of embodiment of the invention will now be described with reference to FIG. 2a which is a simplified perspective view of an ink-jet recording head and FIG. 2b is an enlarged section taken on line A–A' of FIG. 2a.

The ink-jet recording head shown in FIGS. 2a and 2b comprises a single-crystal silicon substrate 101, ink chambers 102 formed on the single-crystal silicon substrate 101, a silicon dioxide film 201 formed over the ink chambers 102, piezoelectric devices that are formed on the silicon dioxide film 201 and which each has a Pt lower electrode (layer) 104, a layer (film) of PZT seed crystals 105, a PZT film 106 and an upper electrode (layer) 107, and a nozzle plate 108 that is joined to the lower side of the single-crystal silicon substrate 101 and which have nozzles 109 formed therein. The ink chambers 102 are arranged on the same pitch as the nozzles 109.

The ink-jet recording head operates as follows. When a voltage is applied between the Pt lower electrode 104 and the upper electrode 107, the piezoelectric device comprising the Pt lower electrode 104, the PZT seed crystal layer 105, the PZT film 106 and the upper electrode 107, as well as the silicon dioxide film 201 are deformed. As a result, the capacity of each ink chamber 102 is reduced, to pressurize its interior, such that the ink filling the chamber 102 is ejected out of the chamber via the associated nozzle 109.

Each of the ink chambers 102 has a length of 100 $\mu$m in the direction in which they are arranged side by side (to the right and left of FIG. 2b) and has a length of 4 mm in the direction in which they extend longitudinally (normal to the paper); each of the PZT seed crystal layers 105 has a length of 80 $\mu$m in the direction in which they are arranged side by side (to the right and left of FIG. 2b).

The ink chambers 102 are arranged side by side at a pitch of 141 $\mu$m to provide a resolution of 180 dpi (dots per inch). In the illustrated case, the PZT seed crystal layer 105 and the PZT film 106 are provided only in the area above the ink chamber 102 whereas they are not provided in the area that corresponds to the gap between adjacent ink chambers 102;

this arrangement ensures that all ink chambers 102 will be displaced by the same amount even if a small voltage is applied.

<Manufacture of the Ink-Jet Recording Head>

Figure 3A:
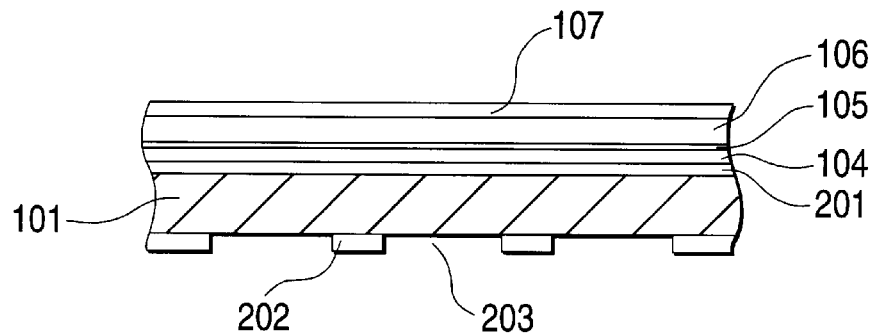
FIGS. 3a to 3c show in section three major steps of the process for manufacturing the ink-jet recording head according to the third embodiment of the invention.
Figure 3B:
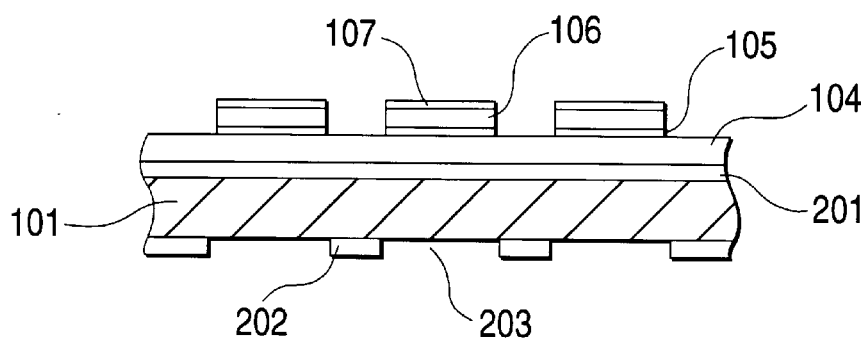
Figure 3C:
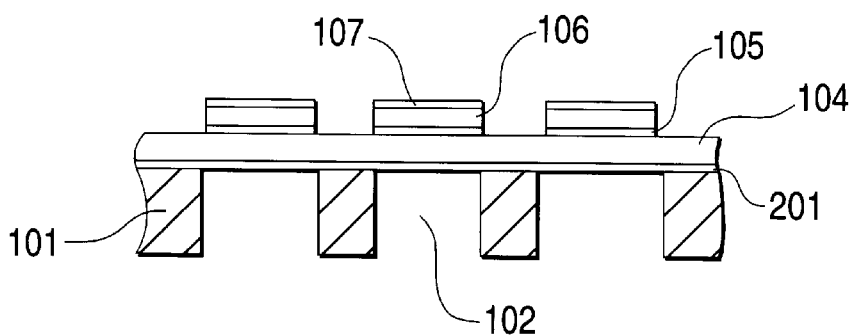

We now describe the process for the manufacture of the ink-jet recording head with reference to FIGS. 3a to 3c. FIGS. 3a to 3c show in cross section the sequence of steps for the manufacture of the ink-jet recording head. In each of the cross sections shown in these figures, the ink chambers 102 are supposed to extend longitudinally in the direction normal to the paper.

In the first step of the process shown in FIG. 3a, a single-crystal silicon substrate 101 having the plane orientation (110) and which has a thickness of 220 $\mu$m is thermally oxidized at 1200° C. by a wet method to form silicon dioxide films 201 and 202 simultaneously on opposite sides of the single-crystal silicon substrate 101.

In the next step, the silicon dioxide film 201 is overlaid with a Pt lower electrode 104, PZT seed crystal layers 105 (formed by the sol-gel method), PZT films 106 (formed by hydrothermal synthesis) and upper electrodes 107. The PZT seed crystal layers 105 and the PZT films 106 may be formed by the sol-gel and hydrothermal synthesis methods, respectively, as in the first case, except that the PZT seed crystal layers had a film thickness of 0.3 $\mu$m whereas the PZT films had a thickness of 3 $\mu$m.

In practice, intermediate layers were formed between the silicon dioxide film 201 and the Pt lower electrode 104 in order to provide better adhesion; as such intermediate layers, titanium, titanium dioxide and titanium were deposited in that order in respective thicknesses of 250, 200 and 50 angstroms. The three intermediate layers (Ti, 250 Å; TiO$_2$, 200 Å; Ti, 50 Å) and the Pt lower electrode 104 were successively formed by DC sputtering, except that the titanium dioxide was deposited by reactive sputtering in a 10% O$_2$ atmosphere.

In the next step, upper electrodes 107 were formed on the PZT film 106 by depositing platinum in a film thickness of 3000 Å through DC sputtering. By thusly ensuring that the film thickness of the upper electrode 107 is 0.5 to 2 times as great as the surface roughness (Rmax=0.4 $\mu$m) of the PZT film 106, all asperities in the surface of the PZT film 106 can be covered, thereby providing satisfactory coverage characteristics. Since the film thickness of the upper electrode 107 is not more than twice the surface roughness of the PZT film, the desired displacement of the piezoelectric devices can be assured (the upper electrode 107 will not prevent the piezoelectric devices from being displaced).

Subsequently, a photoresist was applied to the silicon dioxide film 202 and openings were made in selected positions of the photoresist. With the thus worked photoresist being used as a mask, the dioxide silicon film 202 was patterned with hydrofluoric acid and an aqueous solution of ammonium fluoride. Openings 203 were thus formed in the silicon dioxide film 202 and the direction in which they extended longitudinally (i.e., normal to the paper) was set to be parallel to the (112) plane of the single-crystal silicon substrate 101.

The process then goes to the step shown in FIG. 3b and the upper electrodes 107, PZT films 106 and PZT seed crystal layers 105 are etched in a pattern by ion milling. The patterning was such that the upper electrodes 107, PZT films 106 and PZT seed crystal layers 105 would be left intact in the areas corresponding to the openings 203. The precision in patterning was satisfactory since the grain sizes of the PZT seed crystals 105 and of the crystals in the PZT film 106 were as small as 0.5 $\mu$m.

In the next step shown in FIG. 3c, the surface of the single-crystal silicon substrate 101 on which the piezoelectric devices have been formed is protected with a jig and the substrate is immersed in an aqueous solution of potassium hydroxide at 80° C. so that it is etched anisotropically with the silicon dioxide film 202 being used as a mask to form ink chambers 102.

Since the single-crystal silicon substrate 101 is oriented in the (110) plane whereas the individual openings 203 extend longitudinally in a direction parallel to the (112) plane, the two side walls of each ink chamber 102 which extend along its length can be oriented to be parallel to the (111) plane.

If an aqueous solution of potassium hydroxide is used as the liquid etchant, the etch rate ratio for the single-crystal silicon in the (110) and (111) planes is about 300:1; hence, the degree of side etching which will occur during the formation of grooves equal in depth to the thickness (220 $\mu$m) of the single-crystal silicon substrate 101 can be reduced to about 1 $\mu$m, thereby achieving highly precise formation of ink chambers 102.

Subsequently, with the piezoelectric surface of the single-crystal silicon substrate 101 being protected with the same tool, the silicon dioxide film 202 is etched away with hydrofluoric acid and an aqueous solution of ammonium fluoride. Thereafter, the other side of the substrate on which the ink chambers 102 are open is subjected to desired processing such as joining with a nozzle plate, whereupon a complete ink-jet recording head is produced.

The foregoing description of the third embodiment of the invention concerns the case of continuously patterning the PZT seed crystal layers 105, PZT films 106 and upper electrodes 107 by ion milling; it should, however, be noted that this is not the sole case of the invention and may be replaced by another approach such as this: the layer of PZT seed crystals 105 is first patterned by ion milling, then the PZT film 106 is precipitated selectively and finally the upper electrode 107 is deposited and patterned.

(An Operation of the Ink-Jet Recording Head)

The ink-jet recording head shown in FIG. 2 may be operated in the following specific manner. First, the findings of the present invention will be described. During their deposition, the PZT films 105 and 106 have been polarized spontaneously in a specified direction. Hence, an electric field of 20 V/$\mu$m is usually applied to these PZT films such that the polarization is re-oriented in a desired direction (this process is commonly referred to as "poling"). However, particularly in the case of PZT films prepared by the hydrothermal synthesis technique, even this poling step is incapable of reorienting the spontaneous polarization in a specified direction.

If, in this situation, the polarities of the upper electrode 107 and the lower electrode are not controlled in any way, a problem will arise in that depending on the direction of the applied electric field, it may not be possible to ensure that the PZT films are displaced by sufficiently large amounts (in terms of the width of their shift toward the ink chambers 102). According to the result of the intensive study made by the present inventors, it was found that if the potential of the upper electrode is made higher than that of the lower electrode, preferably by applying the ground potential to the lower electrode while applying a positive potential to the lower electrode, the PZT films are displaced by a little more than about twice the displacement which occurs in the opposite case (i.e., a positive potential is applied to the lower electrode and the ground potential to the upper electrode).

Figure 4:
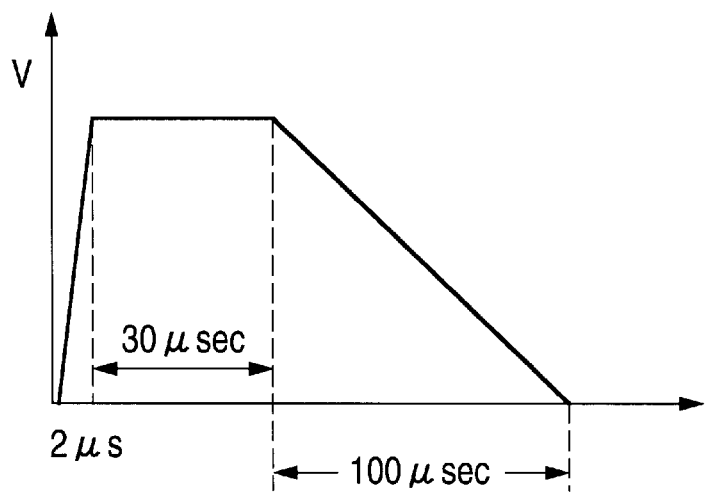

Stated specifically, the PZT films were each displaced by 150 nm when a pulsed potential (20 V/$\mu$m) of the waveform shown in FIG. 4 was applied to the upper electrode. In contrast, the displacement of the PZT films was no more than 70 nm when the same potential was applied to the lower electrode with the upper electrode being grounded.

Figure 5:
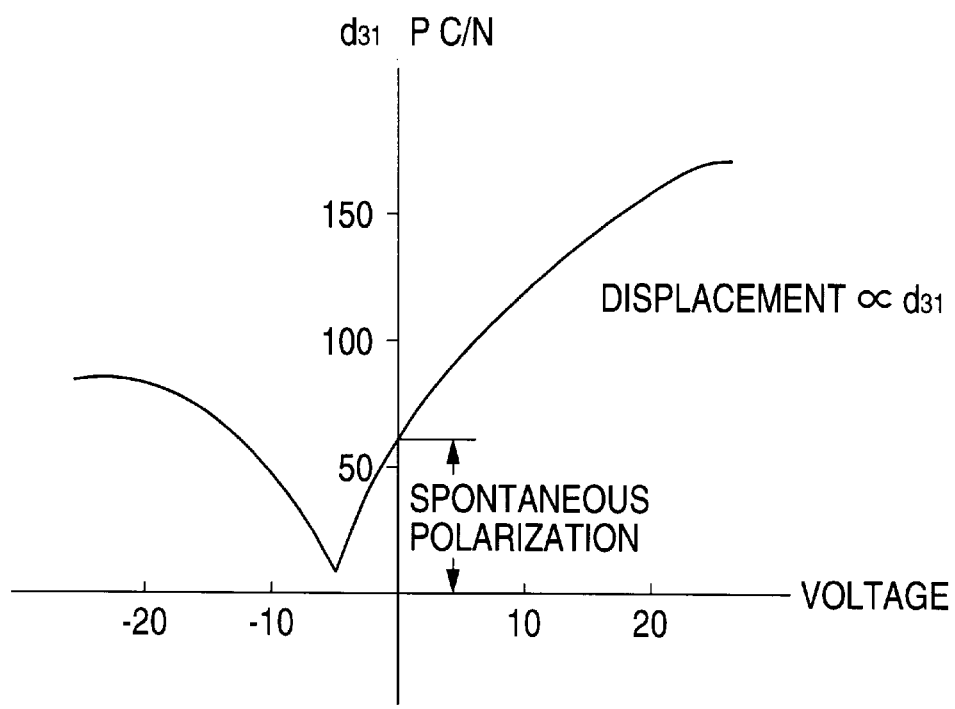
FIG. 5 is a characteristic diagram showing the relationship between the voltage applied to a PZT film and a d constant for its displacement.

FIG. 5 is a characteristic diagram showing how the polarization of PZT films having a total thickness of 1 μm is related to a d constant ($d_{31}$ in pC/N) which is in proportion to the displacement of PZT films. As is clear from FIG. 5, electrically charging the upper electrode to the positive side relative to the lower electrode causes the PZT films to be displaced by a greater amount than in the opposite case.

Except for the application of voltage in the manner just described above, known procedures of field application may be adopted.

It should be noted that if the upper electrode is to be electrically charged to the positive side relative to the lower electrode, the electrolytic corrosion of the lower electrode can be prevented by making the upper electrode of either one of Al, Ni and Ti which have lower redox potentials than Pt (which is exclusively used in the lower electrode in high-temperature processes).

The foregoing description of the invention concerns just one example and it should be understood that the proportions of the constituents of the seed crystal for the piezoelectric thin film, the kind of the feed materials to be used and other features of the invention are by no means limited to the illustrated case.

(Advantages of the Invention)

As described on the foregoing pages, seed crystals prepared by the sol-gel method or the sputtering process which permit the crystal grain size and orientation to be controlled are employed in forming a piezoelectric thin film by the hydrothermal synthesis technique and this enables dense, smooth and highly piezoelectric thin films to be formed in thicknesses of 1 μm and more. As a result, piezoelectric thin-film devices that have high electrostriction constant and which permit fine-line patterning can be manufactured in high yield. The ease with which such piezoelectric thin films can be manufactured offers the added advantage of realizing low-cost manufacture of ink-jet recording heads that use high-performance piezoelectric thin-film devices that need be fabricated in very small feature sizes.

What is claimed is:

1. A piezoelectric thin-film device comprising:
    a substrate; and
    a piezoelectric thin film formed on the substrate, wherein a thickness of the piezoelectric thin film is 1 to 10 μm, a grain size of crystals of the piezoelectric thin film is 0.05 to 1 μm, and a surface roughness (Rmax) of the piezoelectric thin film is no more than 1 μm.

2. The piezoelectric thin-film device according to claim 1, further comprising:
    upper and lower electrode portions provided on respective upper and lower surfaces of the piezoelectric thin film for applying an electric field thereto, wherein the lower electrode portion is made of platinum.

3. The piezoelectric thin-film device according to claim 1, wherein the piezoelectric thin film has a crystal structure oriented in the (100) or (111) plane.

4. The piezoelectric thin-film device according to claim 1, wherein the crystals of the piezoelectric thin film have a crystal size of 0.1 to 0.5 μm.

5. The piezoelectric thin-film device according to claim 2, wherein the upper electrode portion has a thickness 0.5 to 2 times as great as the surface roughness (Rmax) of the piezoelectric thin film.

6. A piezoelectric thin-film device comprising:
    a substrate; and
    a piezoelectric thin film formed on the substrate;
    wherein the piezoelectric thin film has a structure whereby crystals have grown on nuclei composed of fine seed crystals; and
    wherein a thickness of the piezoelectric thin film is 1 to 10 μm, a grain size of crystals of the piezoelectric thin film is 0.05 to 1 μm, and a surface roughness (Rmax) of the piezoelectric thin film is no more than 1 μm.

7. The piezoelectric thin-film device according to claim 6, wherein the crystals of the structure of the piezoelectric thin film have grown on nuclei composed of PZT seed crystals by hydrothermal synthesis.

8. The piezoelectric thin-film device according to claim 7, wherein the PZT seed crystals are produced by either physical vapor deposition (PVD) or chemical vapor deposition (CVD) or spin coating.

9. An ink-jet recording head comprising:
    a substrate having ink chambers formed therein;
    a vibrating diaphragm closing the ink chambers at one end and having a piezoelectric thin-film device of a flexural oscillating mode fixed on a surface of the vibrating diaphragm; and
    a nozzle plate closing the ink chambers at the other end and having ink-ejecting nozzle holes formed therein;
    wherein the piezoelectric thin-film device has a piezoelectric thin film created by the growth of crystals through hydrothermal synthesis on seed crystals of the piezolelectric thin film that have been formed by either physical vapor deposition (PVD) or chemical vapor deposition (CVD) or spin coating; and
    wherein a thickness of the piezoelectric thin film is 1 to 10 μm, a grain size of crvstals of the piezoelectric thin film is 0.05 to 1 μm, and a surface roughness (Rmax) of the piezoelectric thin film is no more than 1 μm.

10. The ink-jet recording head according to claim 9, wherein the piezoelectric thin-film device has both an upper and a lower electrode for electrically charging the piezoelectric thin film and also has means for electrically charging the upper electrode such that it has a positive potential relative to the lower electrode.

* * * * *